US011127596B2

(12) United States Patent
Hwang et al.

(10) Patent No.: US 11,127,596 B2
(45) Date of Patent: Sep. 21, 2021

(54) SEMICONDUCTOR MATERIAL GROWTH OF A HIGH RESISTIVITY NITRIDE BUFFER LAYER USING ION IMPLANTATION

(71) Applicant: Raytheon Company, Waltham, MA (US)

(72) Inventors: Kiuchul Hwang, Amherst, NH (US); Brian D. Schultz, Lexington, MA (US); Amanda Kerr, Chelmsford, MA (US)

(73) Assignee: Raytheon Company, Waltham, MA (US)

( * ) Notice: Subject to any disclaimer, the term of this patent is extended or adjusted under 35 U.S.C. 154(b) by 210 days.

(21) Appl. No.: 16/322,731

(22) PCT Filed: Aug. 2, 2017

(86) PCT No.: PCT/US2017/045010
§ 371 (c)(1),
(2) Date: Feb. 1, 2019

(87) PCT Pub. No.: WO2018/034840
PCT Pub. Date: Feb. 22, 2018

(65) Prior Publication Data
US 2021/0050216 A1 Feb. 18, 2021

Related U.S. Application Data

(60) Provisional application No. 62/376,722, filed on Aug. 18, 2016.

(51) Int. Cl.
*H01L 21/02* (2006.01)
*H01L 21/265* (2006.01)
(Continued)

(52) U.S. Cl.
CPC ...... *H01L 21/2654* (2013.01); *H01L 21/0242* (2013.01); *H01L 21/0254* (2013.01);
(Continued)

(58) Field of Classification Search
CPC .......... H01L 21/2654; H01L 21/02458; H01L 21/0242; H01L 29/207; H01L 29/2003;
(Continued)

(56) References Cited

U.S. PATENT DOCUMENTS 4,642,879 A * 2/1987 Kawata ................. H01L 21/265
438/174
6,555,846 B1 * 4/2003 Watanabe ........... H01L 21/0242
257/103
(Continued)

FOREIGN PATENT DOCUMENTS

CN 102386070 3/2012
CN 102832124 12/2012
(Continued)

OTHER PUBLICATIONS

Notification Concerning Transmittal of International Preliminary Report on Patentability dated Feb. 28, 2019 for International Application No. PCT/US2017/045010; 1 Page.
(Continued)

*Primary Examiner* — Errol V Fernandes
*Assistant Examiner* — Jeremy J Joy
(74) *Attorney, Agent, or Firm* — Daly, Crowley, Mofford & Durkee, LLP

(57) ABSTRACT

A method includes providing a single crystal substrate having a buffer layer on a surface of the substrate. The buffer layer provides a transition between the crystallographic lattice structure of the substrate and the crystallographic lattice structure of the semiconductor layer and has its resistivity increased by ion implanting a dopant into the buffer layer; and forming semiconductor layer on the ion implanted buffer layer. The semiconductor layer may be a wide bandgap semiconductor layer having a high electron mobility transistors formed therein.

18 Claims, 3 Drawing Sheets

(51) Int. Cl.
*H01L 29/20* (2006.01)
*H01L 29/66* (2006.01)
*H01L 29/778* (2006.01)
*H01L 29/36* (2006.01)
*H01L 29/207* (2006.01)

(52) U.S. Cl.
CPC .. *H01L 21/02378* (2013.01); *H01L 21/02381* (2013.01); *H01L 21/02458* (2013.01); *H01L 29/2003* (2013.01); *H01L 29/207* (2013.01); *H01L 29/36* (2013.01); *H01L 29/66462* (2013.01); *H01L 29/7786* (2013.01); *H01L 29/7787* (2013.01)

(58) Field of Classification Search
CPC ........... H01L 29/7786; H01L 29/66462; H01L 29/36; H01L 29/307; H01L 29/02458
See application file for complete search history.

(56) References Cited

U.S. PATENT DOCUMENTS

| | | | |
|---|---|---|---|
| 7,419,892 B2 | 9/2008 | Sheppard et al. | |
| 7,732,301 B1* | 6/2010 | Pinnington | H01L 21/2654 438/455 |
| 2001/0020700 A1* | 9/2001 | Inoue | H01L 29/205 257/20 |
| 2008/0121895 A1* | 5/2008 | Sheppard | H01L 29/66212 257/76 |
| 2009/0045438 A1* | 2/2009 | Inoue | H01L 29/0607 257/192 |
| 2009/0189190 A1* | 7/2009 | Hashimoto | H01L 21/02458 257/194 |
| 2010/0244041 A1* | 9/2010 | Oishi | H01L 29/66462 257/76 |
| 2011/0315808 A1 | 12/2011 | Zelinski et al. | |
| 2014/0021481 A1* | 1/2014 | Lee | H01L 21/02447 257/76 |
| 2014/0175517 A1* | 6/2014 | Cheng | H01L 29/7786 257/194 |
| 2014/0191240 A1* | 7/2014 | Chiang | H01L 21/0254 257/76 |
| 2017/0069746 A1* | 3/2017 | Roberts | H01L 29/7783 |
| 2017/0133217 A1* | 5/2017 | Sato | H01L 21/02381 |
| 2017/0278961 A1* | 9/2017 | Hill | H01L 29/66462 |
| 2019/0198623 A1* | 6/2019 | Yue | H01L 29/32 |

FOREIGN PATENT DOCUMENTS

| | | | | |
|---|---|---|---|---|
| CN | 103579330 | | 2/2014 | |
| JP | 11261052 A | | 9/1999 | |
| JP | 2007-251144 | | 9/2007 | |
| JP | 2007251144 A | * | 9/2007 | ......... H01L 29/7787 |
| JP | 2010-238752 A | | 10/2010 | |
| JP | 2011-003808 A | | 1/2011 | |
| JP | 2012-033773 A | | 2/2012 | |
| JP | 2013-243275 A | | 12/2013 | |
| JP | 2014-022752 A | | 2/2014 | |
| KR | 20100043889 | | 4/2010 | |
| WO | WO 2015/123534 | | 8/2015 | |
| WO | WO-2015123534 A1 | * | 8/2015 | ......... H01L 29/7786 |

OTHER PUBLICATIONS

International Preliminary Report on Patentability dated Feb. 28, 2019 for International Application No. PCT/US2017/045010; 1 Page.
Written Opinion of the ISA dated Feb. 28, 2019 for International Application No. PCT/US2017/045010; 7 Pages.
English Translation of Office Action of Japan Patent Office, dated May 12, 2020, Application No. 2019-508190, 5 pages.
English Translation of Korean Office Action dated Nov. 16, 2020, Application No. 10-2019-7006972, 7 pages.
Notification of Transmittal of the International Search Report and the Written Opinion of the ISA dated Oct. 30, 2017 for International Application No. PCT/US2017/045010; 1 Page.
International Search Report dated Oct. 30, 2017 for International Application No. PCT/US2017/045010; 4 Pages.
Written Opinion of the ISA dated Oct. 30, 2017 for International Application No. PCT/US2017/045010; 8 Pages.
English Translation of Office Action of Korean Patent Act, dated Jul. 20, 2020, Application No. 10-2019-7006972, 3 pages.
S.O. Kucheyev, J.S. Williams, S.J. Pearton, Ion implantation into GaN, Materials Science and Engineering, 22, Reports: A Review Journal, (2001) pp. 51-107, 57 pages.
R.G. Elliman, J.S. Williams, Advances in ion beam modification of semiconductors, Current Opinion in Solid State and Materials Science 19 (2015), pp. 49-67, 19 pages.
K. Santhakumar, K.G.M. Nair, R. Kesavamoorthy, V. Ravichandran, Effect of N+ ion implantation on n-GaN, Nuclear Instruments and Methods in Physics Research B 212 (2003) pp. 381-385, 5 pages.
C. Ronning, E.P. Carlson, R.F.Davis, Ion Implantation Into Gallium Nitride, Physics Report 351 (2001) pp. 349-385, 38 pages.
C.F. Lo, T.S. Kang, L. Liu, C.Y. Chang, S.J. Pearton, I.I. Kravchenko, O. Laboutin, J.W. Johnson, F.Ren, Isolation blocking voltage of nitrogen ion-implanted AlGaN/GaN high electron mobility transistor structure, Applied Physics Letters 97, 262116 (2010), pp. 262116-1-262116-3, 3 pages.
Japanese Office Action with English Translation, Application No. 2019-508190, dated Jan. 26, 2021, 6 pages.
Korean Notice of Allowance, Application No. 10-2019-7006972, dated Mar. 15, 2021, 4 pages.

* cited by examiner

SEMICONDUCTOR MATERIAL GROWTH OF A HIGH RESISTIVITY NITRIDE BUFFER LAYER USING ION IMPLANTATION

CROSS REFERENCE TO RELATED APPLICATIONS

This application is a U.S. National Stage of PCT Application No. PCT/US2017/045010, filed on Aug. 2, 2017, entitled "SEMICONDUCTOR MATERIAL GROWTH OF A HIGH RESISTIVITY NITRIDE BUFFER LAYER USING ION IMPLANTATION," which claims priority to Provisional Patent Application No. 62/376,722, filed on Aug. 18, 2016, which applications are each hereby incorporated herein by reference in their entireties.

TECHNICAL FIELD

This disclosure relates generally to methods and structures having a Group III-Nitride buffer layer and more particularly to methods and structures having a high resistivity Group III-Nitride buffer layer.

BACKGROUND

As is known in the art, Group III-Nitrides are used in many semiconductor devices. The Group III-Nitrides are a family of materials that include Indium Nitride (InN), Gallium Nitride (GaN), Aluminum Nitride (AlN), Boron Nitride (BN) and all of their associated alloys including $In_x(Al_y Ga_{1-y})_{1-x}N$ (where $0 \leq x \leq 1$ and $0 \leq y \leq 1$) and $B_z(In_x(Al_y Ga_{1-y})_{1-x})_{1-z}N$ (where $0 \leq x \leq 1$ and $0 \leq y \leq 1$ and $0 \leq z \leq 1$). Electronic devices often utilize Group III-Nitride materials to take advantage of polarization mismatches that occur when two different Group III-Nitride materials are epitaxially bonded together to produce electrically active carriers at resulting heterojunctions.

As is also known in the art, in many applications these Group-III Nitrides are grown on top of single crystal substrates such as Silicon Carbide (SiC), Silicon (Si), or Sapphire ($Al_2O_3$) substrates. Due to the crystallographic lattice structure mismatches between the crystallographic lattice structure of the substrate and the crystallographic lattice structure of the Group-III Nitride, misfit dislocations form during the epitaxial growth of the Group III-Nitride to reduce the strain in the epitaxial layer and allow the in-plane lattice parameter of the Group III-Nitride to relax towards its bulk lattice structure. For electrical applications, a buffer layer comprised of one or more Group III-Nitride materials is typically grown on a substrate in excess of one micron in thickness before the active device regions are grown to allow the material to relax and to reduce as many defects as possible through the growth process.

The buffer layer is a transition layer, grown between the substrate and a crystalline semiconductor device layer, which minimizes the propagation of crystallographic defects, originating from misfit dislocations at the substrate interface into the crystalline semiconductor device layer. The reduction of dislocations in the buffer layer due to the lattice mismatch is critical for both performance and reliability of transistors subsequently fabricated from the crystalline semiconductor device layer.

As is known in the art, in many applications, the crystalline semiconductor device layer is comprised of a wide bandgap semiconductor material. Wide bandgap refers the difference in energy levels that creates the semiconductor action as electrons switch between the two levels. For example, silicon and other common non-wide-bandgap materials have a bandgap on the order of 0.5 to 1.5 electron volts (eV) whereas wide-bandgap materials in contrast typically have bandgaps on the order of 2 to 6.2 eV. Examples of wide band gap Group III-Nitride semiconductor materials include Gallium Nitride (GaN), Aluminum Nitride (AlN), Aluminum Gallium Nitride (AlGaN), Indium Gallium Nitride (InGaN), and Indium Aluminum Nitride (InAlN).

Here again, due to the crystallographic lattice structure mismatches between the substrate and the wide bandgap semiconductor materials, buffer layers are used to transition between the two lattice structures. A buffer layer can include one or more layers of material and may include layers such as, for example, Aluminum Nitride (AlN), Gallium Nitride (GaN), Aluminum Gallium Nitride (AlGaN), Indium Aluminum Nitride (InAlN), or Indium Gallium Nitride (InGaN), grown on top of a substrate, such as, for example SiC, Si, or sapphire.

The crystalline quality of the lattice matching buffer layer at the surface on which these wide bandgap materials are to be grown, is critical for both performance and reliability of electrical circuits and devices built with these wide bandgap materials. Lattice mismatch between the substrate and the wide bandgap materials causes crystal defects. A buffer material is grown between the substrate and the wide bandgap material as a transition layer, which minimizes the propagation of the crystal defects into the wide bandgap material for active electrical components, such as transistors and diodes, to be built. Defects in the buffer layer can also produce electrically active carriers that are undesirable in many applications. Therefore, it is critical to grow a buffer layer that prevents the crystal defects from propagating into the active wide bandgap material layers, and has high resistivity.

As is also know in the art, a poor quality buffer layer could provide a path of leakage current into the wide bandgap semiconductor if the buffer layer does not have sufficiently high enough resistivity during the operation of transistors. More particularly, in addition to reducing the defect density, the buffer layer, as noted above, also needs to have a high electrical resistivity for many applications including transistors for radio-frequency (RF) applications. As noted above, the buffer layer can provide a path for leakage current beyond the crystalline semiconductor device layer if the buffer layer does not have sufficiently high resistivity during the operation of electronic devices, such as a transistor. Attempts have been made to provide buffer layers with sufficient resistivity such as by introducing impurity dopants into the buffer layer, such as Fe (Iron), Be (Beryllium), and C (Carbon) into the buffer layer during the epitaxial growth of the buffer layer. These impurities can reduce the electrical conductivity of the buffer layer, but they can also negatively impact the electrical performance of devices fabricated from the crystalline semiconductor device layer by reducing carrier concentrations in the crystalline semiconductor device layer or through unwanted charge trapping during device operation.

The buffer layer and crystalline semiconductor layer can be grown by any number of techniques that produce an epitaxial crystalline material layer including Molecular Beam Epitaxy (MBE), Metal-Organic Chemical Vapor Deposition (MOCVD), and Chemical Beam Epitaxy (CBE). The growth conditions required using MBE, MOCVD, or CBE such as substrate temperature, buffer layer composition, buffer layer thickness, and impurity doping levels, are critical to grow a reproducible high quality buffer layer material.

SUMMARY

In accordance with the present disclosure, a method is provided, comprising: providing a single crystal substrate having a buffer layer on a surface of the substrate, the buffer layer having a degree of resistivity; increasing the degree of resistivity of then buffer layer comprising ion implanting a dopant into the buffer layer; and forming semiconductor layer on the ion implanted buffer layer.

In one embodiment, the semiconductor layer is a wide bandgap semiconductor layer.

In one embodiment, the substrate has crystallographic lattice structure, and the semiconductor layer has a crystallographic lattice structure, the buffer layer provides matching between the crystallographic lattice structure of the substrate and the crystallographic lattice structure of the semiconductor layer.

In one embodiment, an ion implantation protection layer is formed on the buffer layer prior to the ion implantation and the dopant ion implanting implants the dopant into the buffer layer with the dopant passing thought the implantation protection layer.

In one embodiment, the ion implantation protection layer is removed after the ion implantation and the semiconductor layer is formed on the exposed buffer layer.

In one embodiment, the buffer layer is a Group III-Nitride.

In one embodiment, the semiconductor layer is a wide bandgap semiconductor layer.

In one embodiment, a high electron mobile transistor is formed in the wide bandgap semiconductor material.

In one embodiment, a semiconductor structure is provided comprising: a single crystal substrate; a buffer layer on a surface of the substrate, the buffer layer having ion implanted resistive dopant therein; and semiconductor layer disposed on the ion implanted buffer layer.

With such method, a buffer layer may be converted into high resistivity material by using ion implantation. This is particularly useful to minimize any leakage current through the buffer material during the operation of transistors built on wide bandgap materials. While ion implantation technology is currently used to isolate active areas that are formed to build active transistors and to prevent cross talk between active transistors because the ion implanted areas become highly resistive, the inventors have recognized that ion implantation used on the buffer layer beneath the transistors is effective and provides an advantageous method to convert the buffers layer into a highly resistive, lattice matching layer. The inventors have recognized that the resistivity of Group III-Nitrides can be significantly increased with ion implantation without significantly altering the crystal structure of the Group III-Nitrides allowing single crystal semiconductor layers to be grown epitaxial on the surface of an electrically insulating ion implanted Group III-Nitride material. The method herein disclosed provides additional tolerance in producing a buffer layer because the ion implantation converts the buffer layer material into highly resistive material regardless of whether it has high defect density such as misfit dislocations that would, absent the ion implantation, be undesirably conductive. While the ion implantation may damage the material of the buffer layer underneath the surface of buffer layer, the top surface off the buffer layer is of sufficient atomic order to enable it be acceptable for subsequent epitaxial growth. Epitaxial single crystal Group III-Nitride films, such as AlN, GaN, AlGaN, InAlN, or InGaN can therefore be grown on top of the buffer layer.

With such method, a doped buffer layer is formed in a relatively simple, reproducible process to generate high resistivity buffer layer because the ion implantation converts the buffer layer material into highly resistive regardless of the quality of buffer layer material.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
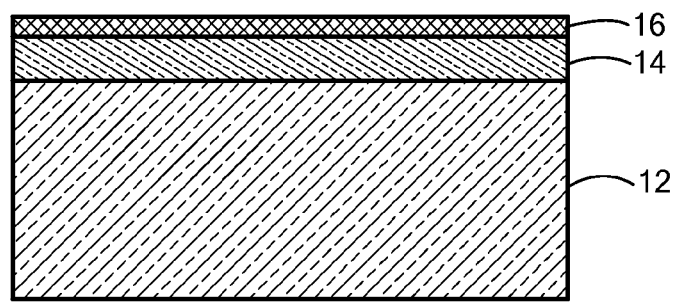
FIGS. 1A-1E are diagrammatical cross-sectional sketches of a structure having a semiconductor material on a substrate with a buffer layer disposed between semiconductor material and the substrate to transition the crystallographic lattice structure of the substrate to the crystallographic lattice structure of the semiconductor layer, at various stages in the fabrication thereof according to the disclosure.

Referring now to FIG. 1A, a single crystal substrate 12, here, for example, Silicon Carbide (SiC), Silicon (Si) or Sapphire ($Al_2O_3$), has a, single crystal, buffer layer 14 deposited epitaxially on the upper surface of the single crystal substrate 12. The buffer layer 14 may be comprised of one or more Group III-Nitride materials such as Aluminum Nitride (AlN), Gallium Nitride (GaN), Aluminum Gallium Nitride (AlGaN), Indium Aluminum Nitride (InAlN), Indium Gallium Nitride (InGaN), and grown on top of the single crystal substrate 12. The buffer layer 14 is often grown in excess of one micron in thickness to allow the material to relax and to reduce as many defects as possible through the growth process. Here, the buffer layer 14 is Gallium Nitride (GaN), for example, having a background electron carrier concentration on the order of $10^{15}$ to $10^{16}/cm^3$ for example.

An ion-implantation protective layer 16 is deposited on the surface of the upper surface of the buffer layer 14. The ion-implantation protective layer 16 can be grown in-situ or ex-situ and can be any material that can be selectively removed through an etch process, here for example, the ion-implantation protective layer 16 is Silicon Nitride ($SiN_x$), Aluminum Nitride (AlN), Aluminum Oxide ($AlO_x$), or Silicon Dioxide ($SiO_2$). The ion-implantation protective layer 16 can be depositing by any deposition technique, for example, MBE, CVD, e-beam, sputtering, or ALD.

Figure 1B:
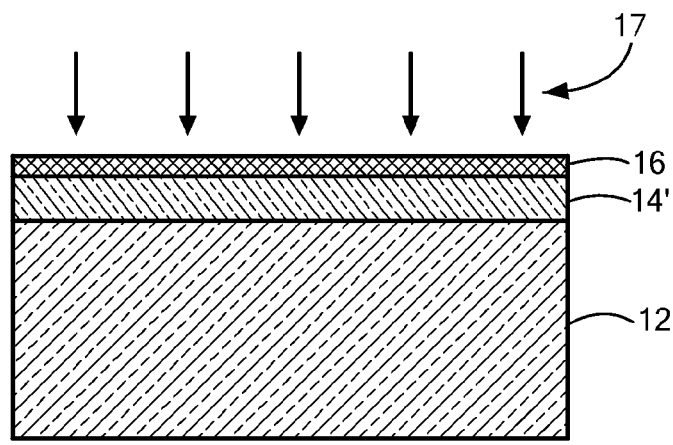

Referring now to FIG. 1B, the upper surface of the structure shown in FIG. 1A is subjected to an ion implantation process (indicated by the arrows) 17, to implant ions, here for example, $N^+$ or $N^{++}$ (Nitrogen ions), to increase the resistivity of the buffer layer 14 to a higher resistivity buffer layer 14', here for example by creating electrically compensating defects in the buffer layer on the order of $10^{20}$ to $10^{21}/cm^3$. This will increase the resistivity of the buffer layer 14 by more than an order of magnitude. For example, the same implantation can increase the resistivity of a 100 nm GaN buffer doped with Si atoms during growth on a Si(111) substrate from a sheet resistivity of 40 ohm/sq to more than 30,000 ohm/sq, which is the measurement limit due to the resistivity contribution from the Si(111) substrate. The vast majority of the ions are implanted through the ion implantation protection layer 16 and into the buffer layer 14. A uniform defect distribution is obtained in the upper portion of the buffer layer 14 by varying the implantation energies and nitrogen doses during implantation. The maximum depth of the implantation is determined by the maximum implantation energy; here for example, the ions are uniformly implanted to a depth of approximately 600 nm below the surface of the buffer layer 14, in this example. The resistivity of the implanted region of the buffer layer 14 is increased due to the implanted ions and is a function of the dose of ions implanted.

It is noted that ion implantation creates defects and disorder in the Group-III Nitride buffer layer 14 and the lattice damage increases with implantation dose. The surface of the Group-III Nitride buffer layer 14 is also expected to experience some damaged due to the nitrogen implantation; however, the degree of damage is dependent on the implantation conditions, such as ion size, dose, and implantation energy. Implantation of a light element like nitrogen and at moderate energy levels on the order of a few 100 keV, is not enough to alter the long range crystallinity or atomic ordering needed for epitaxial growth on the implanted buffer 14'. It should be noted that the ion implantation may extend from the top of the buffer layer 14' down into the substrate 12, or extend only partially from the top of the buffer layer 14' to a region within the buffer layer 14'. To put it another way, the buffer layer 14' can be partially implanted or fully implanted by controlling implantation energy and ion implantation technology.

It is noted that the ion implantation occurs ex-situ from the growth systems used to deposit the Group-III Nitride buffer layer 14. Thus, absent the ion-implantation protective layer 16, with such ex-situ processing, the buffer layer 14 may be inadvertently exposed to hydrocarbons and impurities in the air, as well as directly exposed to the ion implantation beams. However, the ion implantation process can be done in-situ by attaching the ion implantation tool to the material growth chamber, such as MBE, MOCVD, or CBE.

It is noted that the buffer layer 14 surface exposure can be minimized by depositing the ion-implantation protective layer 16 on the upper surface of the buffer layer 14. The ion-implantation protective layer 16 can be grown in-situ or ex-situ and can be any material that can be selectively removed through an etch process, here for example, the ion-implantation protective layer 16 is Silicon Nitride ($SiN_x$), Aluminum Nitride (AlN), Aluminum Oxide ($AlO_x$), or Silicon Dioxide ($SiO_2$). In-situ deposition of the ion-implantation protective layer 16 provides better protection against surface exposure of the buffer layer 14 to hydrocarbons and impurities in the air than ex-situ deposition, while both in-situ and ex-situ deposited ion-implantation protective layers 16 provide additional protection during ion implantation by reducing the exposure of the surface of the buffer layer 14 to the ion implantation beam. After ion implantation the sacrificial layer is removed either through a wet or dry etch process to expose the underlying Group III-Nitride buffer layer surface for growth of a crystalline semiconductor layer, to be described.

Figure 1C:
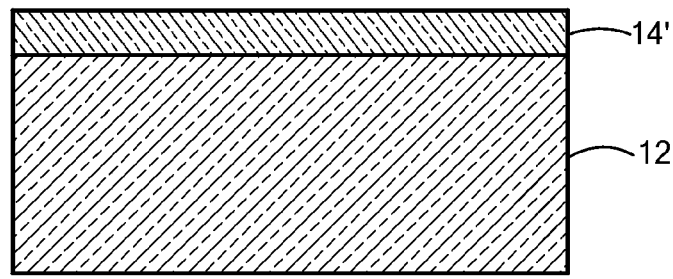

Referring now to FIG. 1C, ion-implantation protective layer 16 is removed either through a wet or dry etch process to expose the underlying surface of the ion implanted, high resistive, buffer layer 14'.

Figure 1D:
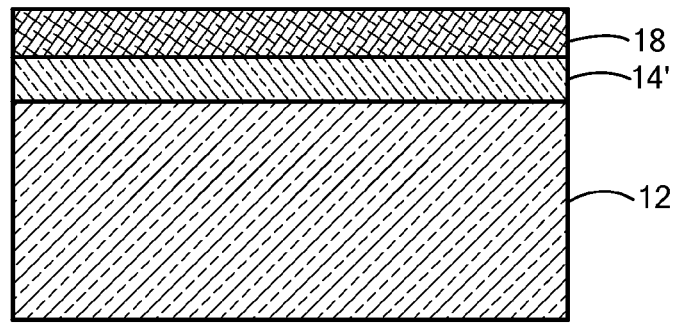
Figure 1E:
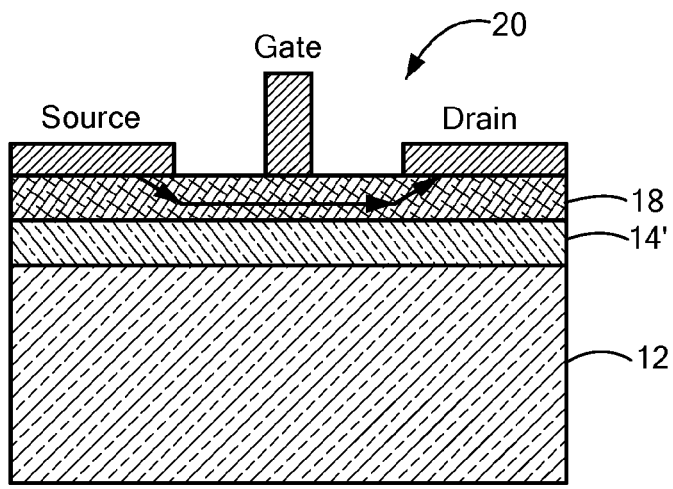
Figure 1F:
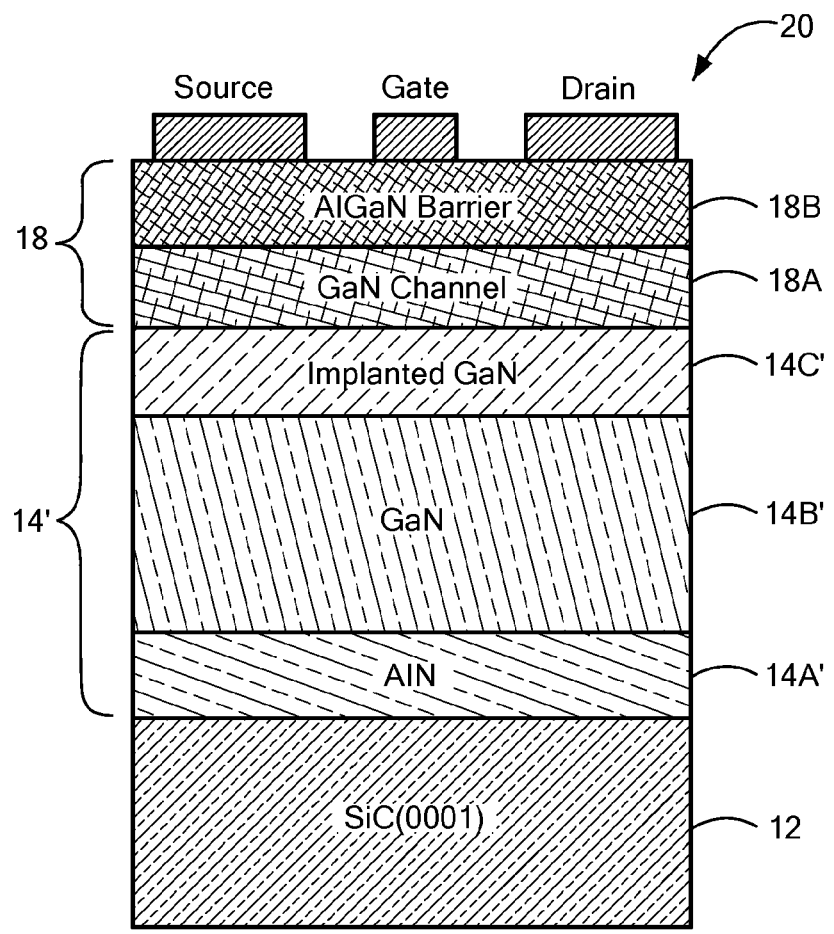
FIG. 1F is a more detailed cross-sectional sketch of the structure shown in FIG. 1E according to the disclosure.

Referring now to FIG. 1D, a crystalline semiconductor layer 18, here for example, a wide bandgap material for forming an active device, here, for example a Field Effect Transistor (FET) 20 in FIG. 1E. The crystalline semiconductor layer 18 can for example include one or more Group III-Nitride materials, such as, a GaN channel layer 18A (FIG. 1F) and an AlGaN barrier layer 18B to form a high electron mobility transistor (HEMT) structure 20, as shown in FIGS. 1E and 1F. The semiconductor layer 18 has the same in-plane lattice structure as the surface of the ion implanted buffer layer 14'; here, for example the semiconductor layer 18 includes an undoped GaN channel layer 18A (FIG. 1F) and an AlGaN barrier layer 18B, and the buffer layer 14' includes primarily an implanted strain relaxed GaN layer 14C' (FIG. 1F) and also includes a portion of the GaN layer 14B' that is not implanted with ions, and an AlN nucleation layer 14A' all of which is on a SiC substrate 12, as shown in FIG. 1F. The implanted layer 14C' and the undoped GaN channel layer 18A are both the same material in this example and therefore are lattice matched. The subsequent AlGaN barrier layer 18B is strained to have the same in-plane lattice parameter as the GaN layers 18A and 14C'. It is often desired for the semiconductor layer 18 formed on a surface of the ion implanted buffer layer to have the same in-plane lattice parameter as the in-plane lattice parameter of the ion implanted buffer layer 14' thereby reducing the impact of additional defects resulting from a lattice mismatch on device performance.

Here, in this example, a three terminal field effect transistor (FET) 20 is formed on the crystalline semiconductor layer 18 using any conventional processing, with ohmic source and drain contacts and a Schottky gate contact, as indicated. The ion implanted region of the high resistance buffer layer 14' is sufficiently resistive to prevent carriers from transporting current through the high resistive buffer layer 14' (indicated by the arrows in FIG. 1E) and thereby confines the carriers to the crystalline semiconductor layer 18.

Referring now to FIG. 1F, a more detailed sketch of the structure is shown. Thus, the semiconductor layer 18 is shown in more detail to include, in this example, an undoped GaN channel layer 18A and an AlGaN barrier layer 18B. The buffer layer 14' includes, approximately 100 nm 1000 nm of a GaN layer which has been implanted with nitrogen ions to form a resistive GaN layer 14C', a GaN layer that is not implanted with ions 14B', and an AlN nucleation layer 14A' all of which is on a SiC substrate 12. In this configuration, the resistive GaN layer provides electrical confinement for the electrons contained in the undoped GaN channel layer 18A. Source and drain contacts are formed in ohmic contact with layer 18B and a gate electrode is formed in Schottky contact with layer 18B using any conventional process.

It is noted that nitrogen ion implantation can create high resistance regions in high electron mobility transistor (HEMT) devices having an AlGaN/GaN semiconductor layer 18. With nitrogen ion implantation, the nitrogen creates defects, such as vacancies and nitrogen interstitials, in Group-III Nitride materials, and makes the materials electrically resistive. As the nitrogen implantation energy is increased, the distribution of defects becomes centered deeper into the material; whereas lower nitrogen implantation energies create defects nearer to the surface of the material. A uniform defect distribution through the material can be achieved by varying the implantation energies and nitrogen doses during implantation. The maximum depth of the implantation is determined by the maximum implantation energy. The defect distribution in the buffer is relatively stable with temperature enabling the Group-III Nitride buffer layer 14 to be reheated to standard wide bandgap epitaxial material layer growth temperatures without annealing out the high resistivity buffer layer created by the implantation. Lower growth temperature techniques for the crystalline semiconductor layer 18, such as MBE, are preferable to higher growth temperature techniques, such as MOCVD, as less damage is removed by thermal annealing resulting from the growth. However, any technique is suitable as long as the increased resistivity in the implanted layer of the buffer layer 14' remains an order of magnitude higher following the growth of the crystalline semiconductor layer 18, than the resistivity of the same layer in buffer layer 14 prior to implantation.

In one embodiment, the bottom portion of the GaN buffer 14' (FIG. 1F) is intentionally doped during epitaxial growth, for example by adding impurities such as carbon, iron and beryllium during the growth process to increase the resistivity of the buffer, prior to ion-implantation and only the top 500 nm of the GaN buffer layer 14' is left undoped. The implantation depth is greater than 500 nm from the surface of buffer layer 14C' and so the whole buffer layer 14' is resistive following implantation, but the top portion of the buffer layer 14C' is from the ion-implantation and the bottom half is from impurity doping during epitaxial growth in layer 14B'. The advantage in this embodiment is that the added doping impurities during epitaxial growth can be kept away for the GaN channel layer 18A in the semiconductor layer 18 and this embodiment therefore eliminates the need to drive the implanted ions through the entire buffer layer 14 to increase resistivity.

Figure 2A:
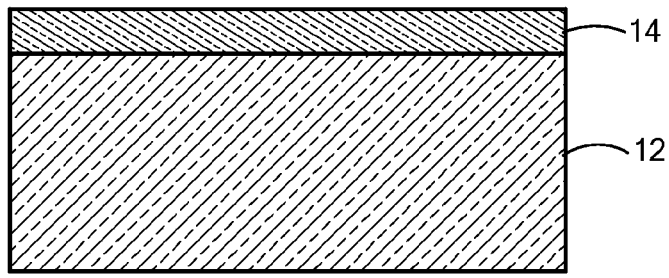
FIGS. 2A-2C are diagrammatical cross-sectional sketches of a structure having a semiconductor material on a substrate with a buffer layer disposed between semiconductor material and the substrate to transition the crystallographic lattice structure of the substrate to the crystallographic lattice structure of the semiconductor layer, at various stages in the fabrication thereof according to another embodiment of the disclosure.
Figure 2B:
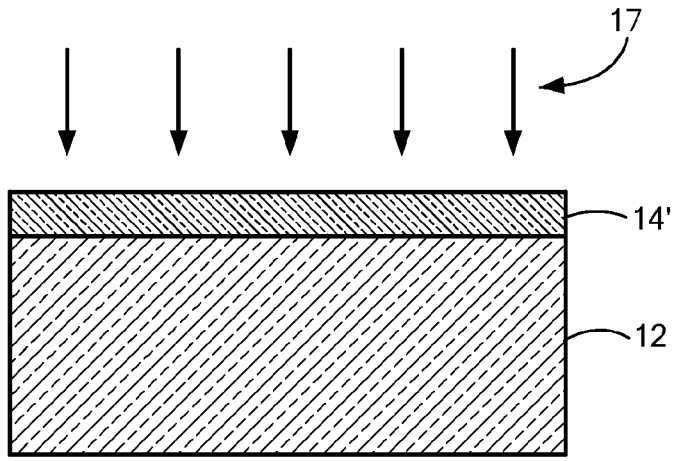
Figure 2C:
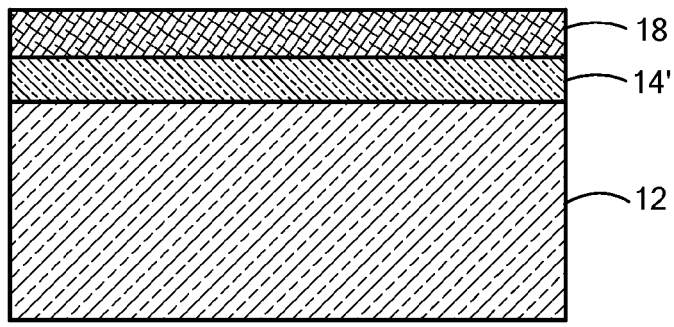

Referring now to FIGS. 2A-2C, here an embodiment is shown where the ion-implantation protective layer 16 in FIG. 1A is not used. Thus, here the ions 17 are implanted directly into the buffer layer 14. The crystalline semiconductor layer 18 (FIG. 2C) is then formed on the ion implanted, high resistance buffer layer 14' as described above in connection with FIG. 1C.

It should now be appreciated a method for forming a semiconductor structure according to the disclosure includes: providing a single crystal substrate having a buffer layer on a surface of the substrate, the buffer layer having a degree of resistivity; increasing the degree of resistivity of the buffer layer comprising ion implanting a dopant into the buffer layer; and forming semiconductor layer on the ion implanted buffer layer. The method may include, independently or in combination, one or more of the following features: wherein the semiconductor layer is a wide bandgap semiconductor layer; wherein the substrate has crystallographic lattice structure, and the semiconductor layer has a crystallographic lattice structure, and wherein the buffer layer provides matching between the crystallographic lattice structure of the substrate and the crystallographic lattice structure of the semiconductor layer; wherein the semiconductor layer is formed on a surface of the ion implanted buffer layer and wherein the semiconductor layer has the same in-plane lattice structure as the surface of the ion implanted buffer layer; wherein an ion implantation protection layer is formed on the buffer layer prior to the ion implantation; and, wherein the dopant ion implanting implants the dopant into the buffer layer with the dopant passing thought the implantation protection layer; wherein the ion implantation protection layer is removed after the ion implantation and the semiconductor layer is formed on the exposed buffer layer; wherein the buffer layer is a Group III-Nitride; wherein the semiconductor layer is a wide bandgap semiconductor layer; wherein the substrate has crystallographic lattice structure, and the semiconductor layer has a crystallographic lattice structure, and wherein the buffer layer provides matching between the crystallographic lattice structure of the substrate and the crystallographic lattice structure of the semiconductor layer; wherein an ion implantation protection layer is formed on the buffer layer prior to the ion implantation; and, wherein the dopant ion implanting implants the dopant into the buffer layer with the dopant passing through the implantation protection layer; wherein the ion implantation protection layer is removed after the ion implantation and the semiconductor layer is formed on the exposed buffer layer; or forming a high electron mobile transistor in the wide bandgap semiconductor material.

It should now also be appreciated a method for forming a semiconductor structure according to the disclosure includes: providing a single crystal substrate having a buffer layer on a surface of the substrate, the buffer layer; increasing resistivity of the buffer layer comprising providing an ion implantation protection layer on the buffer layer; ion implanting a dopant into the buffer layer; removing the ion implantation protection layer to expose the buffer layer; forming a crystalline semiconductor layer on the ion implanted buffer layer; and wherein the resistivity of the buffer layer is increased by the ion implantation.

It should now also be appreciated semiconductor structure according to the disclosure includes: a single crystal substrate; a buffer layer on a surface of the substrate, the buffer layer having ion implanted resistive dopant therein; and a semiconductor layer on the ion implanted buffer layer. The semiconductor structure may include, independently or in combination, one or more of the following features: wherein the buffer layer is a Group III-Nitride; wherein the semiconductor layer is a wide bandgap semiconductor layer; a high electron mobility transistor in the wide bandgap semiconductor material; wherein an upper portion of the buffer layer has the ion implanted ions and a lower portion of the buffer layer has dopant provided therein prior to the ion deposition; or wherein the dopant provided in the lower portion of the buffer layer is provided during formation of the buffer layer.

A number of embodiments of the disclosure have been described. Nevertheless, it will be understood that various modifications may be made without departing from the spirit and scope of the disclosure. For example, the method may be used for forming many other devices on the ion implanted buffer layer 14' than that shown in the example described in connection with FIG. 1F, such as for example, wide bandgap diodes, such as Schottky diodes, PN-diodes, and PIN-diodes. Further, the layers making up layers 14 and 18 in FIG. 1F is only one example of many conventional devices and configurations of Group III-Nitride layers. Further, the method can be used on any orientation of the material and is not limited to any specific crystallographic orientation or polarity. Further, there are a number of elements besides nitrogen that can be implanted into the Group-III Nitrides to provided higher electrical resistivity while allowing epitaxial growth following implantation, such as for example, Be, C, and Ar. Further, in some applications it may be desirable to have a buffer layer 14 with no additional impurity doping atoms added during growth and in some applications it may be desirable to have some or the entire buffer layer 14 doped with impurity atoms during growth.

Further, it should be understood that other single compound substrates 12 may be used such as free standing Group III-N substrates or any crystalline substrate that enables the deposition of one or more crystalline Group III nitride overlayers with a single well defined crystalline orientation with respect to the substrate 12 crystal structure. This includes heterojunction structures formed via the deposition of one or more crystalline materials on another crystalline material, or formed by bonding one or more layers together to define a surface region that is crystalline and supports the crystalline growth of one or more Group III nitride materials. Accordingly, other embodiments are within the scope of the following claims.

What is claimed is:

1. A method for forming a semiconductor structure, comprising:
    providing a single crystal substrate having a buffer layer on a surface of the substrate, the buffer layer having a degree of resistivity;
    increasing the degree of resistivity of the buffer layer comprising ion implanting ions into the buffer layer such that an upper portion of the buffer layer has ion implanted ions therein; and
    forming semiconductor layer on the ion implanted buffer layer;
    wherein a lower portion of the buffer layer has dopant provided therein prior to the ion implanting; and
    wherein the ions are nitrogen ions and the dopant provided in the lower portion of the buffer layer is carbon, ion or beryllium.

2. The method recited in claim 1 wherein the semiconductor layer is a wide bandgap semiconductor layer.

3. The method recited in claim 1 wherein the substrate has crystallographic lattice structure, and the semiconductor layer has a crystallographic lattice structure, and wherein the buffer layer provides matching between the crystallographic lattice structure of the substrate and the crystallographic lattice structure of the semiconductor layer.

4. The method recited in claim 1 wherein the semiconductor layer is formed on a surface of the ion implanted buffer layer and wherein the semiconductor layer has the same in-plane lattice structure as the surface of the ion implanted buffer layer.

5. The method recited in claim 1 wherein an ion implantation protection layer is formed on the buffer layer prior to the ion implantation; and, wherein the dopant ion implanting implants the dopant into the buffer layer with the dopant passing thought the implantation protection layer.

6. The method recited in claim 5 wherein the ion implantation protection layer is removed after the ion implantation and the semiconductor layer is formed on the exposed buffer layer.

7. The method recited in claim 1 wherein the buffer layer is a Group III-Nitride.

8. The method recited in claim 7 wherein the semiconductor layer is a wide bandgap semiconductor layer.

9. The method recited in claim 7 wherein the substrate has crystallographic lattice structure, and the semiconductor layer has a crystallographic lattice structure, and wherein the buffer layer provides matching between the crystallographic lattice structure of the substrate and the crystallographic lattice structure of the semiconductor layer.

10. The method recited in claim 7 wherein an ion implantation protection layer is formed on the buffer layer prior to the ion implantation; and, wherein the ion implanting implants the ions into the buffer layer with the ions passing through the implantation protection layer.

11. The method recited in claim 10 wherein the ion implantation protection layer is removed after the ion implantation and the semiconductor layer is formed on the exposed buffer layer.

12. The method recited in claim 8 including forming a high electron mobile transistor in the wide bandgap semiconductor material.

13. A method for forming a semiconductor structure, comprising:
    providing a single crystal substrate having a buffer layer on a surface of the substrate, the buffer layer;
    increasing resistivity of the buffer layer comprising providing an ion implantation protection layer on the buffer layer;
    ion implanting ions into the buffer layer such that an upper portion of the buffer layer has ion implanted ions therein;
    removing the ion implantation protection layer to expose the buffer layer;
    forming a crystalline semiconductor layer on the ion implanted buffer layer; and
    wherein the resistivity of the buffer layer is increased by the ion implantation;
    wherein th lower portion of the buffer layer has dopant provided therein prior to the ion implanting; and
    wherein the ions are nitrogen ions and the dopant provided in the lower portion of the buffer layer is carbon, ion or beryllium.

14. A semiconductor structure, comprising:
    a single crystal substrate;
    a buffer layer on a surface of the substrate, wherein an upper portion of the buffer layer has ion implanted ions therein and a lower portion of the buffer layer has dopant provided therein prior to the ion implantation; and
    a semiconductor layer on the ion implanted buffer layer;
    wherein the ion implanted ions are nitrogen ions and the dopant provided in the lower portion of the buffer layer is carbon, ion or beryllium.

15. The structure recited in claim 14 wherein the buffer layer is a Group III-Nitride.

16. The structure recited in claim 15 wherein the semiconductor layer is a wide bandgap semiconductor layer.

17. The structure recited in claim 16 including a high electron mobility transistor in the wide bandgap semiconductor material.

18. The structure recited in claim 14 wherein the dopant provided in the lower portion of the buffer layer is provided during formation of the buffer layer.

* * * * *